(12) United States Patent
Hsu et al.

(10) Patent No.: US 12,362,276 B2
(45) Date of Patent: *Jul. 15, 2025

(54) SEMICONDUCTOR PACKAGE HAVING A SEMICONDUCTOR DEVICE BONDED TO A CIRCUIT SUBSTRATE THROUGH A FLOATED OR GROUNDED DUMMY CONDUCTOR AND METHOD OF MANUFACTURING THE SAME

(71) Applicant: Taiwan Semiconductor Manufacturing Company, Ltd., Hsinchu (TW)

(72) Inventors: Feng-Cheng Hsu, New Taipei (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 175 days.

This patent is subject to a terminal disclaimer.

(21) Appl. No.: 17/835,991

(22) Filed: Jun. 9, 2022

(65) Prior Publication Data

US 2022/0302030 A1 Sep. 22, 2022

Related U.S. Application Data

(63) Continuation of application No. 16/871,035, filed on May 10, 2020, now Pat. No. 11,387,183, which is a
(Continued)

(51) Int. Cl.
*H01L 23/528* (2006.01)
*H01L 21/48* (2006.01)
(Continued)

(52) U.S. Cl.
CPC ...... *H01L 23/5283* (2013.01); *H01L 21/6835* (2013.01); *H01L 23/49811* (2013.01);
(Continued)

(58) Field of Classification Search
CPC . H01L 24/17; H01L 2224/1701–17107; H01L 2224/1751–17519
See application file for complete search history.

(56) References Cited

U.S. PATENT DOCUMENTS 6,787,918 B1* 9/2004 Tsai .................... H05K 3/3452
257/E21.503
9,000,584 B2 4/2015 Lin et al.
(Continued)

*Primary Examiner* — Younes Boulghassoul
(74) *Attorney, Agent, or Firm* — JCIPRNET

(57) ABSTRACT

A semiconductor device including an integrated circuit, a dielectric layer, a plurality of connecting terminals and at least one dummy conductor is provided. The integrated circuit has a plurality of connecting pads, and the dielectric layer is disposed thereon and partially exposes the plurality of the connecting pads by a plurality of openings defined therein. The plurality of the connecting terminals is disposed on the plurality of the connecting pads exposed by the plurality of the openings. The at least one dummy conductor is disposed on the dielectric layer and electrically isolated from the integrated circuit. A substantial topology variation is between the plurality of the connecting terminals and the at least one dummy conductor. A semiconductor package having the semiconductor device is also provided.

20 Claims, 12 Drawing Sheets

Related U.S. Application Data continuation of application No. 15/398,724, filed on Jan. 5, 2017, now Pat. No. 10,692,813.

(60) Provisional application No. 62/427,135, filed on Nov. 28, 2016.

(51) Int. Cl.
    *H01L 21/683* (2006.01)
    *H01L 23/00* (2006.01)
    *H01L 23/498* (2006.01)

(52) U.S. Cl.
    CPC .............. *H01L 24/09* (2013.01); *H01L 24/17* (2013.01); *H01L 21/4853* (2013.01); *H01L 21/4857* (2013.01); *H01L 23/49822* (2013.01); *H01L 2221/68359* (2013.01); *H01L 2224/0401* (2013.01); *H01L 2224/05027* (2013.01); *H01L 2224/05572* (2013.01); *H01L 2224/13021* (2013.01); *H01L 2224/1403* (2013.01); *H01L 2224/14517* (2013.01); *H01L 2224/16237* (2013.01); *H01L 2224/16238* (2013.01); *H01L 2224/1703* (2013.01); *H01L 2224/17517* (2013.01); *H01L 2224/73204* (2013.01); *H01L 2224/81005* (2013.01); *H01L 2224/83005* (2013.01); *H01L 2224/92125* (2013.01); *H01L 2224/94* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2005/0104222 A1* | 5/2005 | Jeong | H05K 3/3436 257/784 |
| 2012/0098123 A1* | 4/2012 | Yu | H01L 23/49827 257/E23.06 |
| 2013/0043583 A1* | 2/2013 | Wu | H01L 21/563 257/737 |
| 2013/0069229 A1* | 3/2013 | Kang | H01L 24/17 257/737 |
| 2013/0099377 A1* | 4/2013 | Yu | H01L 25/0655 257/737 |
| 2013/0127048 A1* | 5/2013 | Hasegawa | H01L 25/0657 257/737 |
| 2014/0027904 A1* | 1/2014 | Kusanagi | H01L 23/49838 257/737 |
| 2014/0061897 A1* | 3/2014 | Lin | H01L 24/17 257/737 |
| 2014/0167254 A1* | 6/2014 | Yu | H01L 24/17 257/737 |
| 2015/0115441 A1* | 4/2015 | Lu | H01L 23/49894 257/738 |
| 2016/0005707 A1* | 1/2016 | Kwon | H01L 24/11 257/737 |
| 2016/0148888 A1* | 5/2016 | Ryu | H01L 24/17 257/737 |
| 2017/0092609 A1* | 3/2017 | Yajima | H01L 24/11 |
| 2018/0060479 A1* | 3/2018 | Lo | H01L 24/17 |

* cited by examiner

SEMICONDUCTOR PACKAGE HAVING A SEMICONDUCTOR DEVICE BONDED TO A CIRCUIT SUBSTRATE THROUGH A FLOATED OR GROUNDED DUMMY CONDUCTOR AND METHOD OF MANUFACTURING THE SAME

CROSS-REFERENCE TO RELATED APPLICATION

This application is a continuation application of and claims the priority benefit of a prior U.S. application Ser. No. 16/871,035, filed on May 10, 2020. The prior U.S. application Ser. No. 16/871,035 is a continuation application of and claims the priority benefit of a prior application Ser. No. 15/398,724, filed on Jan. 5, 2017, now allowed, which claims the priority benefit of U.S. provisional application Ser. No. 62/427,135, filed on Nov. 28, 2016. The entirety of each of the above-mentioned patent applications is hereby incorporated by reference herein and made a part of this specification.

BACKGROUND

Integrated circuits are used in a variety of electronic applications, such as personal computers, cell phones, digital cameras, and other electronic equipment. Many integrated circuits may be processed and packaged with other semiconductor devices or die, and various technologies have been developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
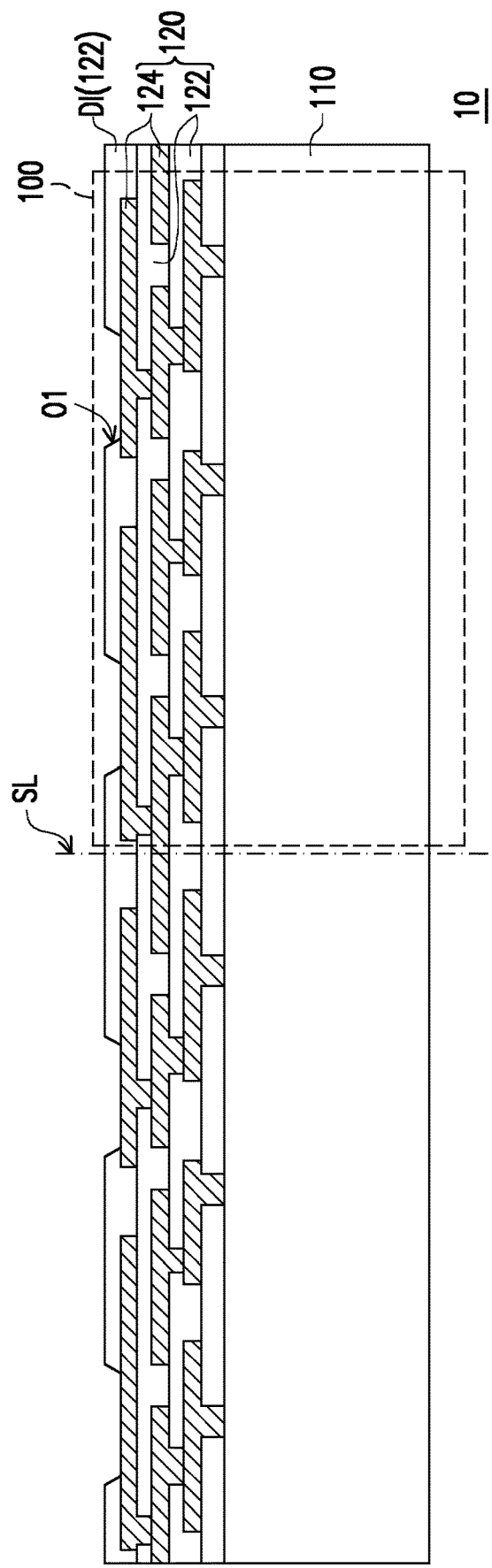
FIG. 1A to FIG. 1D are schematic cross-sectional views of various stages in a manufacturing process of a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are schematic cross-sectional views of various stages in a manufacturing process of a semiconductor device according to some exemplary embodiments of the present disclosure. Referring to FIG. 1A, a wafer 10 is provided. In some embodiments, the wafer 10 includes a plurality of integrated circuits 100 arranged in a form of an array. Before a wafer sawing or dicing process along a scribe line SL (shown as the dotted line in FIGS. 1A-1D) is performed on the wafer 10, the integrated circuits 100 of the wafer 10 are connected one another, as shown in FIG. 1A. In FIG. 1A, only two integrated circuits 100 are shown in FIG. 1A for illustration.

In FIG. 1A, each of the integrated circuits 100 includes a semiconductor substrate 110 and an interconnection structure 120 disposed on the semiconductor substrate 110. The interconnection structure 120 covers the semiconductor substrate 110. In some embodiment, the semiconductor substrate 110 may be a silicon substrate including active components (e.g., diodes, transistors or the like) and passive components (e.g., resistors, capacitors, inductors or the like) formed therein.

In some embodiments, the interconnection structure 120 may include a plurality of inter-dielectric layers 122 and a plurality of patterned conductive layers 124 stacked alternately. For example, the plurality of the inter-dielectric layers 122 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process.

In some embodiments, the plurality of the inter-dielectric layers 122 may be formed by suitable fabrication techniques such as spin-on coating, chemical vapor deposition (CVD), plasma-enhanced chemical vapor deposition (PECVD) or the like. For example, the plurality of patterned conductive layers 124 is made of conductive materials formed by electroplating or deposition, such as copper, copper alloy, aluminum, aluminum alloy, or combinations thereof, which may be patterned using a photolithography and etching process. In some embodiments, the plurality of patterned conductive layers 124 may be patterned copper layers or other suitable patterned metal layers.

Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In FIG. 1A, a portion of the topmost patterned conductive layer 124 is exposed by a plurality of openings O1 defined in the topmost inter-dielectric layer 122, in which the topmost inter-dielectric layer 122 having the plurality of the openings O1 may be referred as a dielectric layer DI. In other words, a portion of the topmost patterned conductive layer 124 is exposed by a plurality of openings O1 in the dielectric layer DI (122) as indicated in FIG. 1A. In some embodiments, the thickness of the dielectric layer DI is between 2 and 10 μm. In some embodiments, the dielectric layer DI acts as a passivation layer, and a material of the dielectric layer DI is, for example, made of inorganic materials, such as silicon oxide, silicon nitride, silicon oxynitride, or any suitable dielectric material, which may be patterned using a photolithography and/or etching process.

In some embodiments, the integrated circuits 100 are manufactured through a front end of line (FEOL) process. However, the disclosure is not limited thereto. It should be appreciated that the illustration of the integrated circuits 100 and other components throughout all figures is schematic and is not in scale.

Figure 1B:
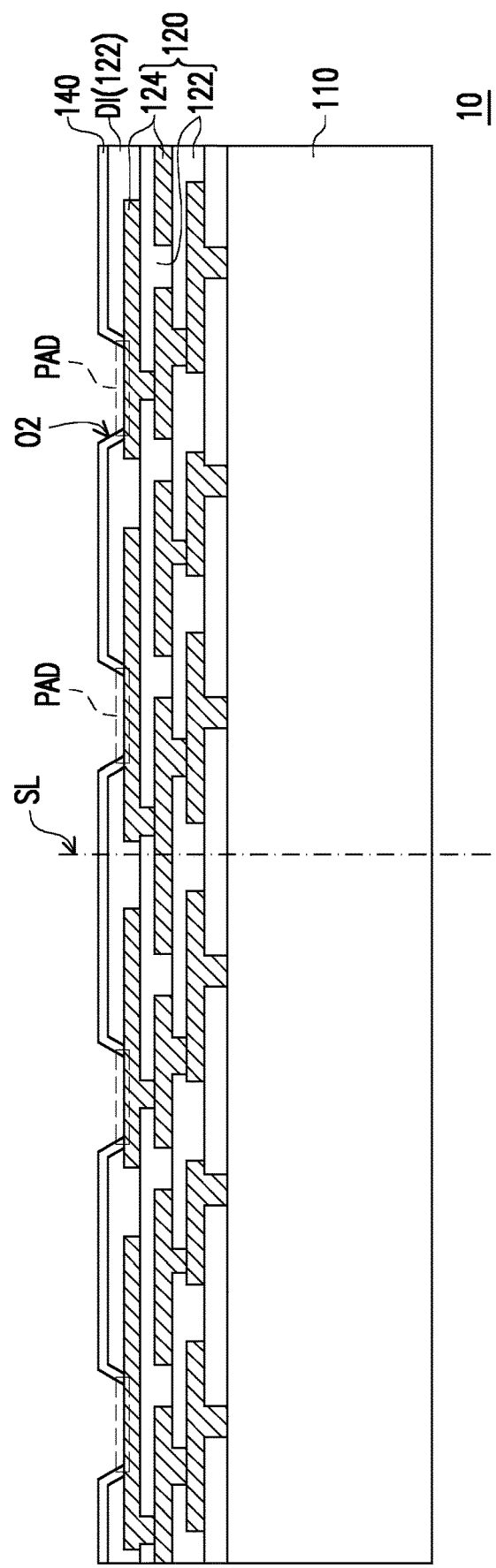

In FIG. 1B, a buffer layer 140 is formed on the integrated circuits 100 of the wafer 10. In some embodiments, the buffer layer 140 is conformally disposed on the dielectric layer DI and has a plurality of openings O2 respectively exposing a corresponding one of the topmost patterned conductive layer 124 exposed by the plurality of the openings O1 in the dielectric layer DI. In some embodiments, the buffer layer 140 may be made of organic materials, such as a polyimide (PI) layer, a polybenzoxazole (PBO) layer, other suitable polymer layer, or any suitable dielectric material. The patterning processes, for example, could be performed by photolithography and/or etching processes.

As shown in FIGS. 1A and 1B, the topmost patterned conductive layer 124 of the plurality of patterned conductive layers 124 exposed by the plurality of the openings O1 in the dielectric layer DI is partially covered by the buffer layer 140, such that the topmost patterned conductive layer 124 exposed by the plurality of the openings O1 in the dielectric layer DI is further exposed by the plurality of the openings O2 in the buffer layer 140. The topmost patterned conductive layer 124 exposed by the plurality of the openings O2 in the buffer layer 140 is referred as a plurality of connecting pads PAD.

In some embodiments, the plurality of the connecting pads PAD exposed by the plurality of the openings O2 in the buffer layer 140 are separated from each other by respective dielectric layer(s) (e.g., the dielectric layer DI and/or the buffer layer 140). In some embodiments, the plurality of the connecting pads PAD is used to electrically couple the integrated circuits 100 to external connections, such as conductive pads.

Figure 1C:
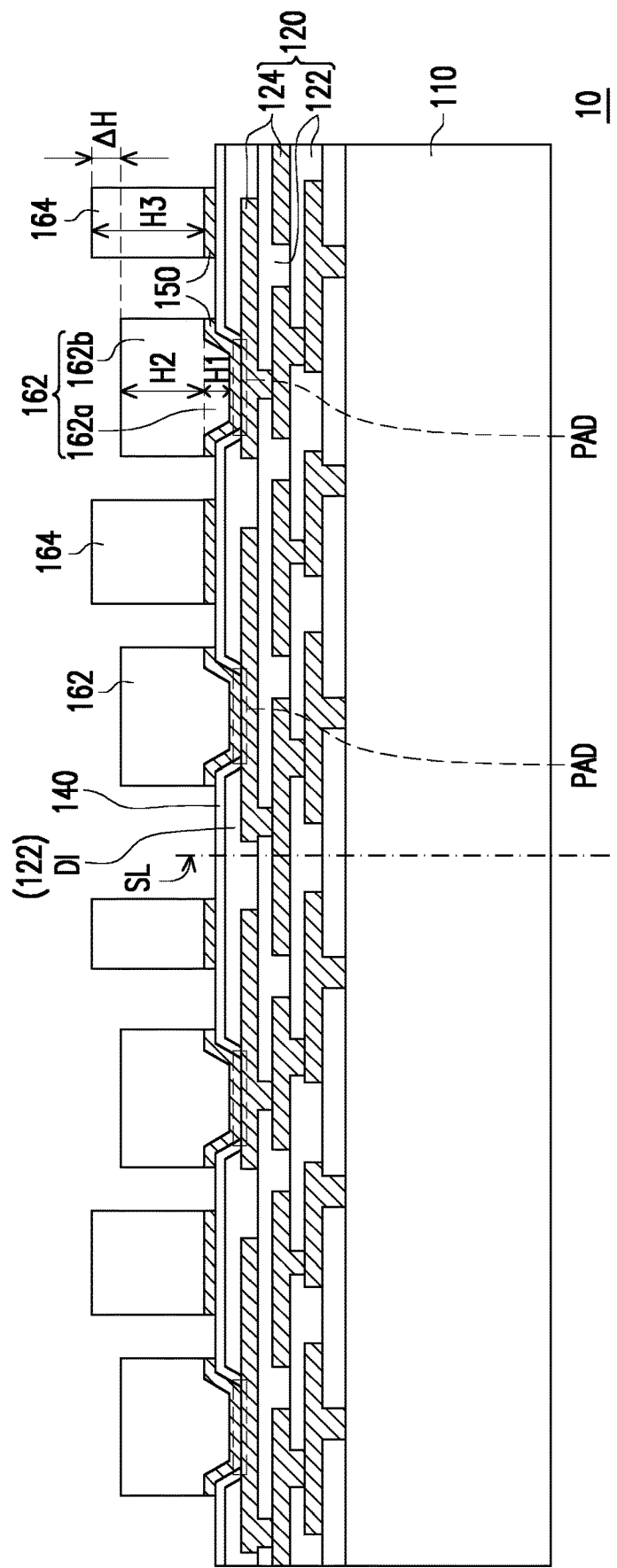

In FIG. 1C, a plurality of conductive pads 150 is formed on the buffer layer 140, and a plurality of connecting terminals 162 and at least one dummy conductor 164 are formed on the plurality of the conductive pads 150, respectively. As shown in FIG. 1C, a portion of the plurality of the conductive pads 150 is formed through the openings O2 in the buffer layer 140 to contact the plurality of the connecting pads PAD (e.g., the topmost patterned conductive layer 124 of the connection structure 120 exposed by the openings O2 in the buffer layer 140), and a portion of the plurality of the conductive pads 150 is formed on the buffer layer 140 without contacting the plurality of the connecting pads PAD. In some embodiments, the portion of the plurality of the conductive pads 150 contacting the plurality of the connecting pads PAD may be referred to as under bump metallurgies (UBMs).

For example, the formation of the plurality of the conductive pads 150, the plurality of the connecting terminals 162 and the at least one dummy conductor 164 includes that, a seed layer (not shown) is conformally and entirely formed over the buffer layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer, or two titanium layers and a cupper layer sandwiched between the two titanium layers. The seed layer may be formed using, for example, sputtering or the like.

Sequentially, a photo resist (not shown) is then formed and patterned on the seed layer. The photo resist may be formed by spin coating or the like and may be exposed to light for patterning. At least a portion of the pattern of the photo resist corresponds to the plurality of the connecting pads PAD exposed by the plurality of the openings O2 in the buffer layer 140. The patterning process forms openings through the photo resist to expose the seed layer, wherein a portion of the exposed portions of the seed layer corresponds to and contacts the plurality of the connecting pads PAD exposed by the plurality of the openings O2 in the buffer layer 140.

A conductive material (not shown) is then formed in the openings defined in the photo resist and on the exposed portions of the seed layer to form the plurality of the connecting terminals 162 on the portion of the exposed portions of the seed layer contacting the plurality of the connecting pads PAD and to form the at least one dummy conductor 164 on a portion of the exposed portions of the seed layer without contacting the plurality of the connecting pads PAD. In other words, the plurality of the connecting terminals 162 is electrically connected to the integrated circuits 100, and the at least one dummy conductor 164 is electrically isolated from the integrated circuits 100. In some embodiments, the plurality of the connecting terminals 162 may be used to electrically connect other semiconductor devices or be electrically grounded. In some embodiments, the at least one dummy conductor 164 may be electrically floated or electrically grounded. The disclosed is not limited thereto.

Figure 1D:
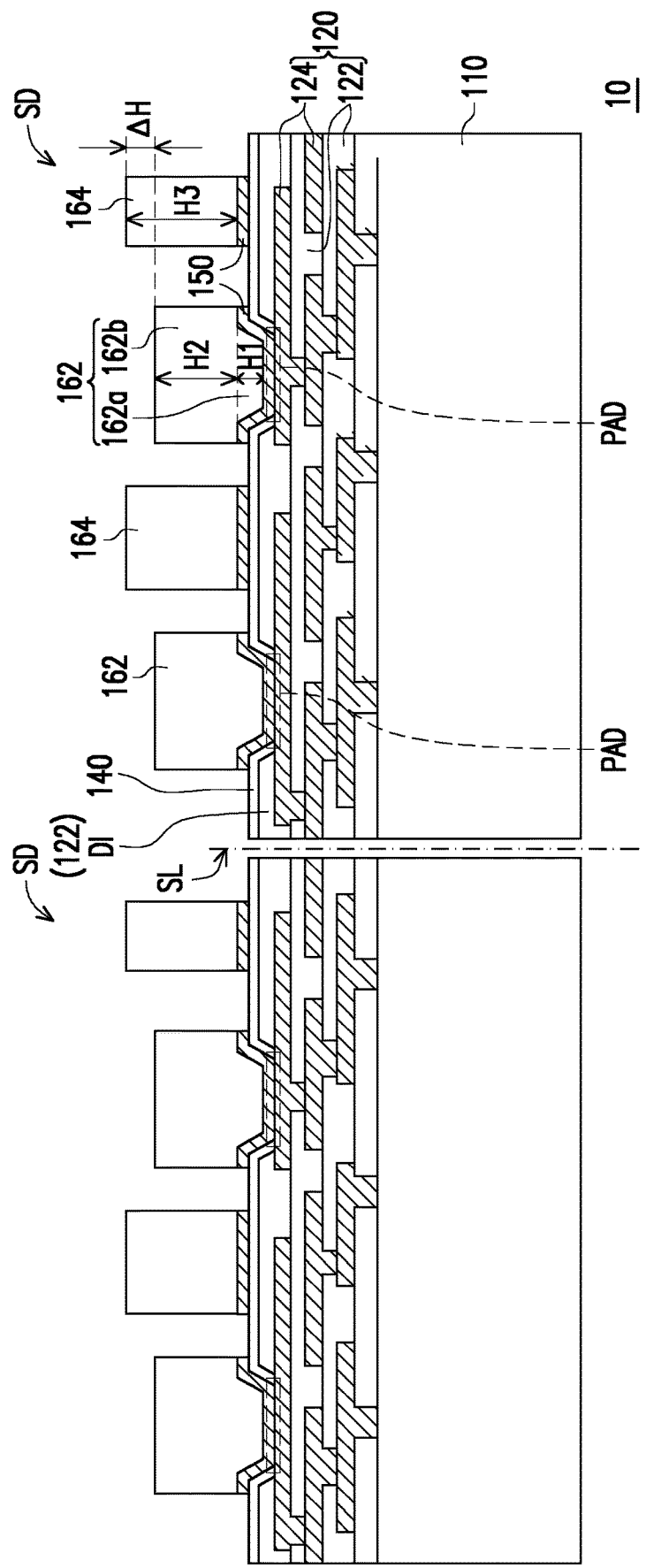

The conductive material may be formed by plating, such as electroplating or electroless plating, or the like. The conductive material may comprise a metal, such as copper, aluminum, gold, nickel, silver, palladium, tin, or the like. In some embodiments, the plurality of the connecting terminals 162 and the at least one dummy conductor 164 may be high lead or head-free. The plurality of the connecting terminals 162 and the at least one dummy conductor 164 may be metal pillars (as shown in FIG. 1D), ball grid array (BGA) connectors, solder balls, controlled collapse chip connection (C4) bumps, micro bumps, electroless nickel-immersion gold technique (ENIG) formed bumps, electroless nickel-electroless palladium-immersion gold technique (ENEPIG) formed bumps, or the like. In addition, a reflow process may be performed in order to shape the conductive material into the desired bump shapes.

After the plurality of the connecting terminals 162 and the at least one dummy conductor 164 are formed, the photo resist is removed by an ashing or stripping process, such as using an oxygen plasma or the like. Once the photo resist is removed, portions of the seed layer, which is not covered by the conductive material, are removed by using an etching process to form the plurality of the conductive pads 150. In some embodiments, the etching process may be wet or dry etching. However, the disclosure is not limited thereto.

In some embodiments, the portions of the seed layer, which is not covered by the conductive material, are removed by using the plurality of the connecting terminals 162 and the at least one dummy conductor 164 as a mask for performing a self-align patterning process, as so to form the plurality of the conductive pads 150. In other words, the plurality of the connecting terminals 162 and the plurality of the conductive pads 150 underlying thereof share the same pattern, and the at least one dummy conductor 164 and the plurality of the conductive pads 150 underlying thereof share the same pattern. That is, as shown in FIG. 1C, sidewalls of the plurality of the connecting terminals 162 and the plurality of the conductive pads 150 underlying thereof are substantially aligned, and sidewalls of the at least one dummy conductor 164 and the plurality of the conductive pads 150 underlying thereof are substantially aligned.

As shown in FIG. 1C, each of the plurality of the connecting terminals 162 includes a first conductive portion 162a and a second conductive portion 162b. The first conductive portion 162a is disposed in the plurality of the openings O2 in the buffer layer 140, the second conductive portion 162b connects the first conductive portion 162a, and a sum of a height H1 of the first conductive portion 162a and a height H2 of the second conductive portion 162b is substantially equal to a height H3 of the at least one dummy conductor 164. Owing to structure of the first conductive portion 162a, there is a substantial topology variation ΔH between the plurality of the connecting terminals 162 and the at least one dummy conductor 164, wherein the substantial topology variation ΔH, in an intended purpose, is at least 3 μm. In some embodiments, the substantial topology variation ΔH is between 3 μm to 10 μm. The substantial topology variation ΔH is mainly occurred due to the presence of the dielectric layer DI and is greatly affected by the thickness the dielectric layer DI, such that the substantial topology variation ΔH can be adjusted by modifying the thickness of the dielectric layer DI. The substantial topology variation ΔH between the plurality of the connecting terminals 162 and the at least one dummy conductor 164 becomes larger as the thickness of the dielectric layer DI becomes larger. Due to a controllable the substantial topology variation ΔH, smaller critical dimensions are permissible for the plurality of the connecting terminals 162 and the at least one dummy conductor 164, thereby obtaining a better process control for sequential process(es).

On the other hand, each of the plurality of the connecting terminals 162 substantially has the same height to one another, and even as a height difference exists between any two of the plurality of the connecting terminals 162, the height difference between any two of the plurality of the connecting terminals 162 is in an acceptable tolerance, and thus is negligible. The acceptable tolerance is the height difference between any two of the plurality of the connecting terminals 162, wherein the difference is, say, less than 2 μm. As the height difference falls within the acceptable tolerance, the height difference between any two of the plurality of the connecting terminals 162 is insignificant and is considered unintentional. Similarly, in some embodiments, the at least one dummy conductor 164 includes, for example, two or more dummy conductors, the dummy conductors substantially have the same height, and even as a height difference exists between any two dummy conductors, the height difference between any two dummy conductors is in an acceptable tolerance, which is negligible. The acceptable tolerance is the height difference between any two of the dummy conductors, wherein the ratio is, say, less than 2 μm. As the height difference falls within the acceptable tolerance, the height difference between any two of the dummy conductors is insignificant and is considered unintentional.

In some embodiments, a width (or a diameter) of at least one of the plurality of the connecting terminals 162 is different from a width (or a diameter) of the at least one dummy conductor 164, as shown in FIG. 1C. In some embodiments, the at least one dummy conductor 164 includes, for example, two or more dummy conductors, wherein the two or more dummy conductors may have different widths (or different diameters).

In FIG. 1D, a dicing process (e.g., singulation) is performed to cut the wafer 10 along the scribe line SL into individual and singulated semiconductor devices SD. In one embodiment, the dicing process is a wafer dicing process. Up to this, the semiconductor device SD is manufactured. In addition, owing to the at least one dummy conductor 164, a mechanical strength is enhanced after the semiconductor device is bonded to another semiconductor device or carrier.

Figure 2:
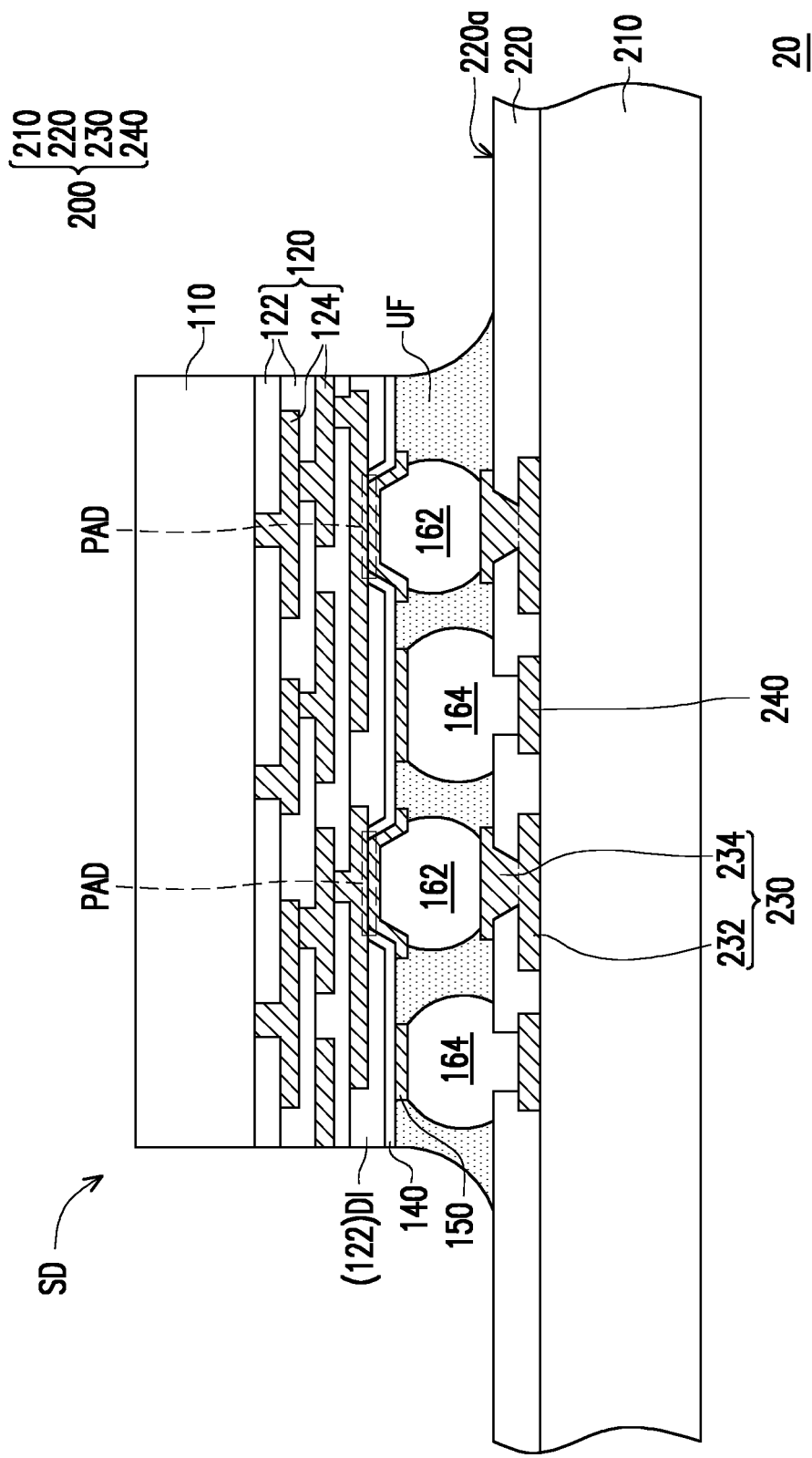
FIG. 2 is a schematic cross-sectional view illustrating a semiconductor package according to some exemplary embodiments of the present disclosure.

FIG. 2 is a schematic cross-sectional view illustrating another semiconductor package according to some exemplary embodiments of the present disclosure. In FIG. 2, a circuit substrate 200 and a semiconductor device SD are bonded. The semiconductor device SD in FIG. 2 is the semiconductor device SD depicted in FIG. 1D, the detailed description regarding the semiconductor device SD in FIG. 2 can be found above, and a repeated description of the same technical contents may be omitted.

As mentioned above, the semiconductor device SD includes the integrated circuit, the buffer layer 140, the plurality of the conductive pads 150, the plurality of the connecting terminals 162, and the at least one dummy conductor 164. The integrated circuit has the semiconductor substrate 110 and the interconnection structure 120, wherein the interconnection structure 120 is disposed on the semiconductor substrate 110. The buffer layer 140 is disposed on the interconnection structure 120 of the integrated circuit, in which the integrated circuit has the plurality of the connecting pads PAD (e.g., the portion of the topmost patterned conductive layer 124 of the interconnection structure 120 exposed by the plurality of the openings O2 in the buffer layer 140), and the dielectric layer DI (e.g., the topmost inter-dielectric layer 122 of the interconnection structure 120) partially exposes the plurality of the connecting pads PAD.

A portion of the plurality of the conductive pads 150 is disposed on and electrically connected to the plurality of the connecting pads PAD exposed by the buffer layer 140 (and the dielectric layer DI), and a portion of the plurality of the conductive pads 150 is disposed on the buffer layer 140 and electrically isolated from the plurality of the connecting pads PAD exposed by the buffer layer 140 (and the dielectric layer DI). The plurality of the connecting terminals 162 is electrically connected to the portion of the plurality of the conductive pads 150 electrically connected to the plurality of the connecting pads PAD exposed by the buffer layer 140, and the at least one dummy conductor 164 is electrically connected to the portion of the plurality of the conductive pads 150 disposed on the buffer layer 140 and electrically isolated from the plurality of the connecting pads PAD.

Owing to structure of the plurality of the connecting terminals 162, the substantial topology variation ΔH between the plurality of the connecting terminals 162 and the at least one dummy conductor 164 is noticeable and is at least 3 μm. In some embodiments, the substantial topology variation ΔH is between 3 μm to 10 μm. Due to the controllable substantial topology variation ΔH mentioned above, smaller critical dimensions are permissible for the plurality of the connecting terminals 162 and the at least one dummy conductor 164. In some embodiments, a diameter of at least one of the plurality of the connecting terminals 162 is different from a diameter of the at least one dummy conductor 164. In some embodiments, the at least one dummy conductor 164 includes, for example, two or more dummy conductors, wherein the two or more dummy conductors may have different diameters.

As shown in FIG. 2, the circuit substrate 200 comprises a substrate 210, a solder mask layer 220, a plurality of first bonding pads 230, and a plurality of second bonding pads 240, wherein the plurality of the first bonding pads 230 and the plurality of the second bonding pads 240 are electrically isolated from each other through the solder mask layer 220. In some embodiments, the substrate 210 includes metal traces (or metal lines) and vias underlying and connected to the metal traces or other semiconductor devices. The solder mask layer 220 is disposed on the substrate 210 and separates the plurality of the first bonding pads 230 away from the plurality of the second bonding pads 240.

In some embodiments, the plurality of the first bonding pads 230 includes a first portion 232 and a second portion 234, wherein the first portion 232 is disposed on the substrate 210 and is partially exposed by a plurality of first openings defined in the solder mask layer 220, and the second portion 234 contacts the first portion 232 and is disposed in the plurality of the first openings in the solder mask layer 230, and the second portion 232 extends to a surface 220a of the solder mask layer 220 facing toward the semiconductor device SD. In some embodiments, the plurality of the first bonding pads 230 may be referred to as a UBM-like pad. In some embodiments, the plurality of the first bonding pads 230 is respectively electrically connected to the metal traces (or metal lines) underlying to couple to the other components in the substrate 210 through the first portion 232.

In some embodiments, the plurality of the second bonding pads 240 is disposed on the substrate 210 and is partially exposed by a plurality of second openings defined in the solder mask layer 220. In some embodiments, the plurality of the second bonding pads 240 may be referred to as a solder mask defined (SMD) pad. In some embodiments, the plurality of the second bonding pads 240 may be respectively electrically connected to the metal traces (or metal lines) underlying to couple to the other components in the substrate 210 or electrically floated (or electrically grounded).

In some embodiments, the first portion 232 of the plurality of the first bonding pads 230 and the plurality of the second bonding pads 240 are in the same layer. For example, the formation of the solder mask layer 220, the plurality of the first bonding pads 230 and the plurality of the second bonding pads 240 may include that, a conductive material (not shown) is deposited on the substrate 210 and then patterned to form the first portion 232 of the plurality of the first bonding pads 230 and the plurality of the second bonding pads 240, the solder mask layer 220 is coated over the first portion 232 of the plurality of the first bonding pads 230 and the plurality of the second bonding pads 240 and patterned to form the plurality of the first openings exposing the first portion 232 of the plurality of the first bonding pads 230 and the plurality of the second openings exposing the plurality of the second bonding pads 240. Then, the second portion 234 of the plurality of the first bonding pads 230 is formed on the first portion 232 of the plurality of the first bonding pads 230 by wire bonding machine, and the second portion 234 can be a stud bump. In some embodiments, the patterning process may be a photolithography and/or etching process.

However, the disclosure does not limit the formation process(es) of the solder mask layer 220, the plurality of the first bonding pads 230 and the plurality of the second bonding pads 240. In other embodiments, a patterned photo resist is formed to have openings only exposing the first portion 232 of the plurality of the first bonding pads 230, then a deposition process is performed to form the second portion 234 of the plurality of the first bonding pads 230 on the first portion 232 and in the openings of the patterned photo resist. Once the second portion 234 of the plurality of the first bonding pads 230 is formed, the patterned photo resist is removed by an ashing or stripping process.

In FIG. 2, the semiconductor device SD is flipped (turned upside down) and then disposed on the circuit substrate 200. In other words, the semiconductor device SD and the circuit substrate 200 are bonded through flip chip bonding technology. In some embodiments, a underfill UF at least fills the gaps between the semiconductor device SD and the circuit substrate 200. In one embodiment, the underfill UF may be formed by underfill dispensing or any other suitable method.

Due to the substantial topology variation ΔH presented in the semiconductor device SD, the plurality of the connecting terminals 162 is connected to the second portion 234 of the plurality of the first bonding pads 230, and the at least one dummy conductor 164 is connected to the plurality of the second bonding pads 240. The semiconductor device SD is electrically connected to the circuit substrate 200 through the plurality of the connecting terminals 162 and the plurality of the first bonding pads 230. As mentioned above, the substantial topology variation ΔH is adjustable, and smaller critical dimensions are permissible for the plurality of the connecting terminals 162 and the at least one dummy conductor 164, thus the better process control can be obtained. Owing to the at least one dummy conductor 164, a mechanical strength of the semiconductor package is enhanced after the semiconductor device SD is bonded to the circuit substrate 200. In certain embodiments, as the at least one dummy conductor is electrically grounded, a signal integrity enhancement and/or a noise reduction of the semiconductor package can be obtained.

Figure 3:
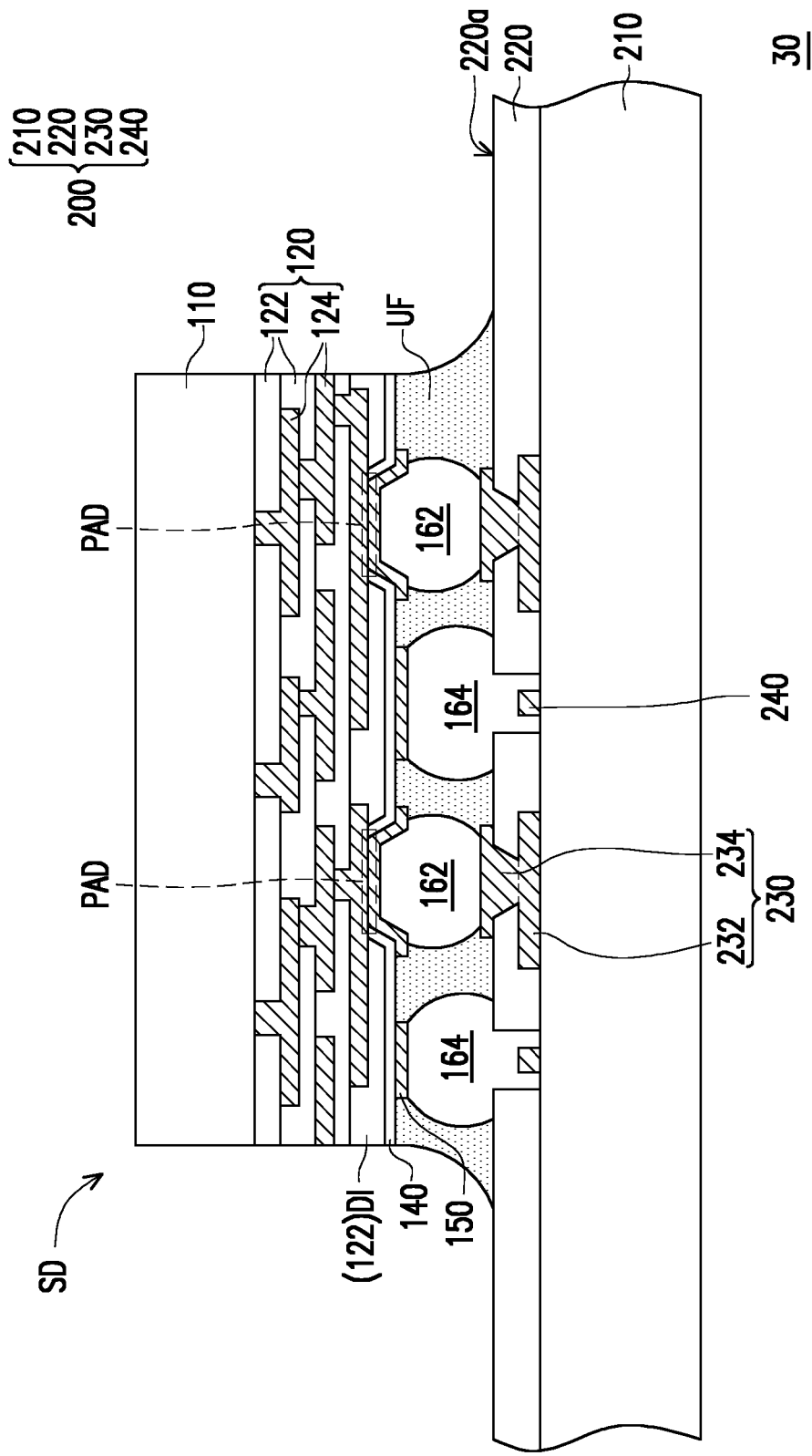
FIG. 3 is a schematic cross-sectional view illustrating another semiconductor package according to some exemplary embodiments of the present disclosure.

FIG. 3 is a schematic cross-sectional view illustrating a semiconductor package according to some exemplary embodiments of the present disclosure. As seen in FIG. 3, the semiconductor package 30 is similar to the semiconductor package 20 of FIG. 2. The elements similar to or substantially the same as the elements described previously will use the same reference numbers, and the descriptions of the same elements is not repeated herein. The difference is, in FIG. 3, the plurality of the second bonding pads 240 of the semiconductor package 30 is entirely exposed by the plurality of the second openings in the solder mask layer 220. As shown in FIG. 3, the plurality of the second bonding pads 240 is spaced apart from a sidewall of the second openings in the solder mask layer 220 by a gap. That is, the plurality of the second bonding pads 240 is not contacted to the solder mask layer 220. In some embodiments, the plurality of the second bonding pads 240 of semiconductor package 30 may be referred to as a non-solder mask defined (NSMD) pad.

Figure 4:
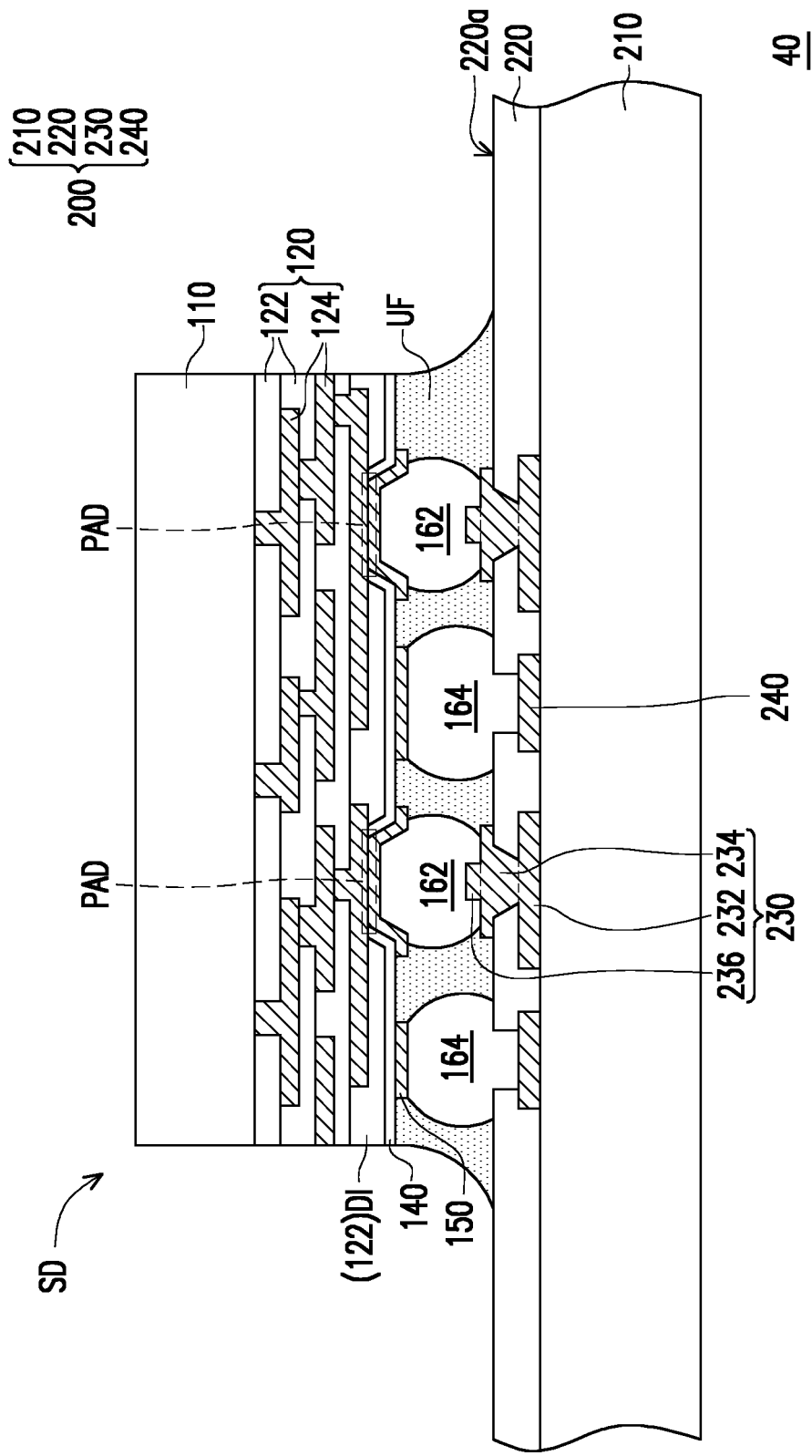
FIG. 4 is a schematic cross-sectional view illustrating another semiconductor package according to some exemplary embodiments of the present disclosure.

FIG. 4 is a schematic cross-sectional view illustrating another semiconductor package according to some exemplary embodiments of the present disclosure. As seen in FIG. 4, the semiconductor package 40 is similar to the semiconductor package 20 of FIG. 2. The elements similar to or substantially the same as the elements described previously will use the same reference numbers, and the descriptions of the same elements is not repeated herein. The difference is, in FIG. 4, the plurality of the first bonding pads 230 of the semiconductor package 40 further comprises a third portion 236 connecting to the second portion 234, and the third portion 236 protrudes away from the second portion 234 (or saying protrudes toward the semiconductor device SD). As shown in FIG. 4, the semiconductor device SD is electrically connected to the circuit substrate 200 through the first portion 232, the second portion 234 and the third portion 236 of the plurality of the first bonding pads 230 and the plurality of the connecting terminals 162. In some embodiments, the second portion 234 and the third portion 236 of the plurality of the first bonding pads 230 may be simultaneously formed on the first portion 232 of the plurality of the first bonding pads 230 by wire bonding machine, in which the second portion 234 and the third portion 236 are treated as a stud bump. However, the disclosure does not limit the manufacturing processes of the second portion 234 and the third portion 236 of the plurality of the first bonding pads 230.

Figure 5:
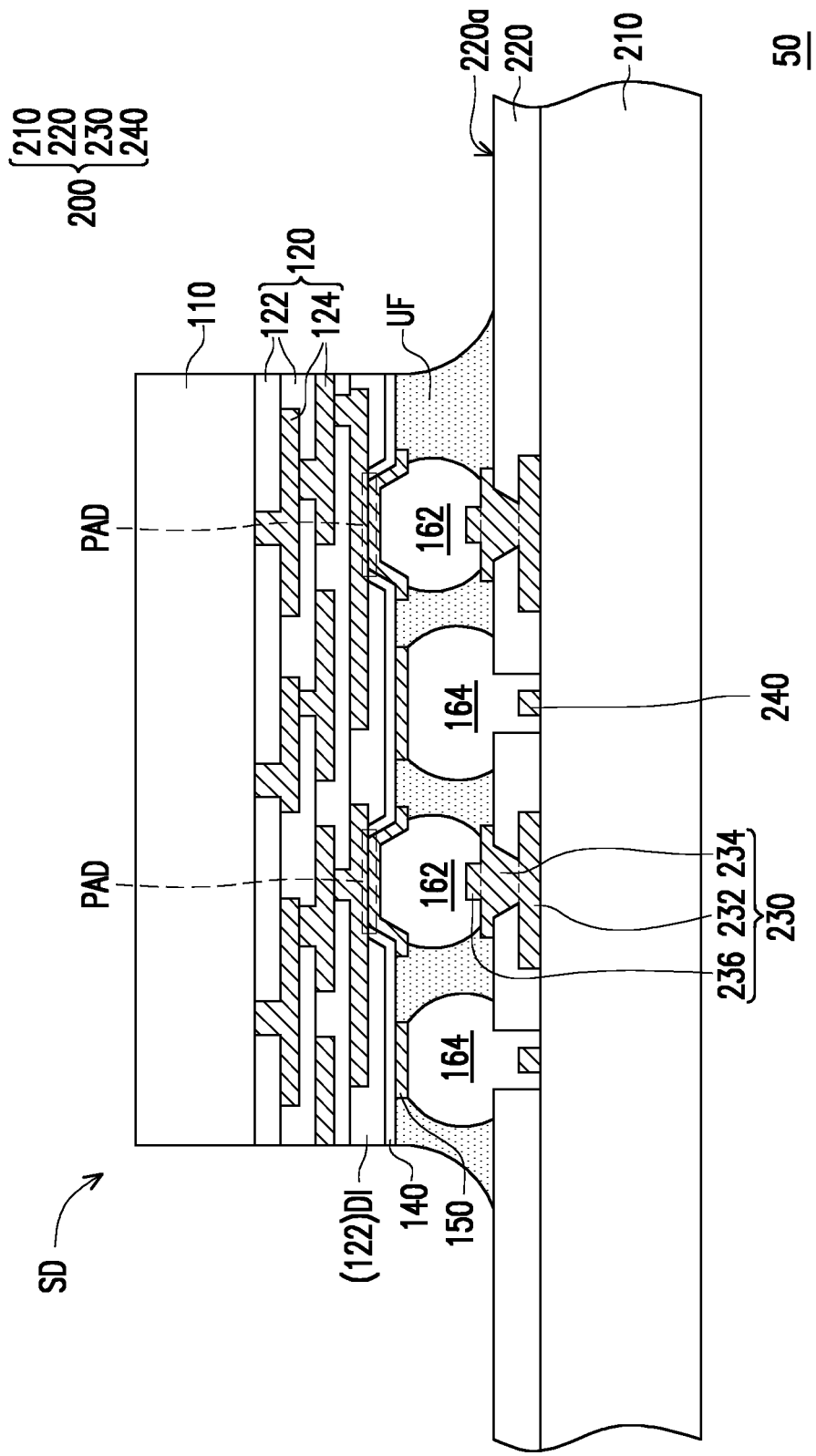
FIG. 5 is a schematic cross-sectional view illustrating another semiconductor package according to some exemplary embodiments of the present disclosure.

FIG. 5 is a schematic cross-sectional view illustrating another semiconductor package according to some exemplary embodiments of the present disclosure. As seen in FIG. 5, the semiconductor package 50 is similar to the semiconductor package 30 of FIG. 3. The elements similar to or substantially the same as the elements described previously will use the same reference numbers, and the descriptions of the same elements is not repeated herein. The difference is, in FIG. 5, the plurality of the first bonding pads 230 of the semiconductor package 50 further comprises a third portion 236 connecting to the second portion 234, and the third portion 236 protrudes away from the second portion 234 (or saying protrudes toward the semiconductor device SD). As shown in FIG. 5, the semiconductor device SD is electrically connected to the circuit substrate 200 through the first portion 232, the second portion 234 and the third portion 236 of the plurality of the first bonding pads 230 and the plurality of the connecting terminals 162.

The disclosed is not limited to the embodiments depicted in FIGS. 2-5. In some embodiments, due to the substantial topology variation ΔH presented in a semiconductor device, one semiconductor package may include different configurations between the plurality of the connecting terminals 162 and the plurality of the first bonding pads 230 (e.g., the UBM-like pad or the UBM-like pad having an additional protruding portion) and/or between the at least one dummy conductor 164 and the plurality of the second bonding pads 240 (e.g., the SMD pad or the NSMD pad).

FIG. 6A to FIG. 6D are schematic cross-sectional views of various stages in a manufacturing process of a semiconductor package according to some exemplary embodiments of the present disclosure. The elements similar to or substantially the same as the elements described previously will use the same reference numbers, and certain details or descriptions of the same elements may not be repeated herein.

Figure 6A:
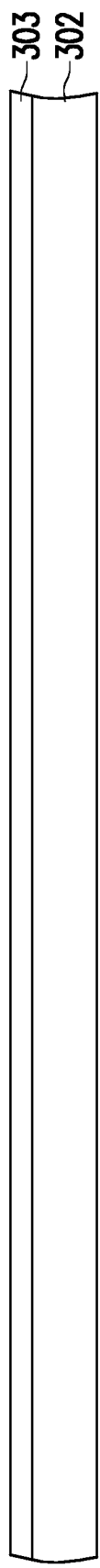
FIG. 6A to FIG. 6D are schematic cross-sectional views of various stages in a manufacturing process of a semiconductor package according to some exemplary embodiments of the present disclosure.

In FIG. 6A, a carrier 302 is provided, the carrier 302 may be a glass carrier or any suitable carrier for the manufacturing method of a redistribution layer circuit structure. In some embodiments, the carrier 302 is provided with a debond layer 303 coated thereon, and the material of the debond layer 303 may be any material suitable for debonding the carrier 302 from the above layers disposed thereon. However, the disclosure is not limited thereto. The debond layer 303 may be an optional layer that can be omitted in other embodiments.

Figure 6B:
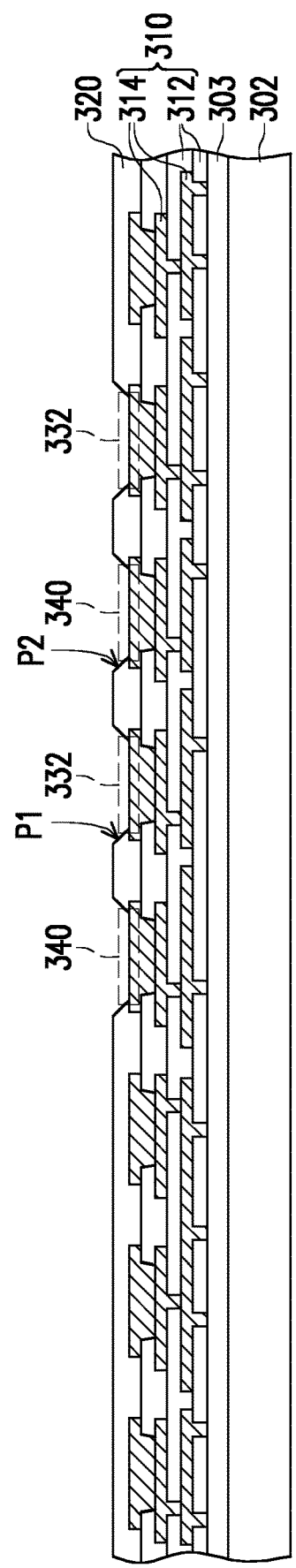

In FIG. 6B, a redistribution layer 310 is formed on the debond layer 303 disposed on the carrier 302. For example, the formation of the first redistribution layer 310 includes sequentially forming one or more polymer dielectric layers 312 and one or more metallization layers 314 in alternation. In certain embodiments, as shown in FIG. 6B, the metallization layers 314 are sandwiched between the polymer dielectric layers 312, but a top surface of the topmost layer of the metallization layers 314 is exposed and the lowest layer of the metallization layers 314 is directly disposed to the debond layer 203.

In some embodiments, the material of the metallization layers 314 includes aluminum, titanium, copper, nickel, tungsten, and/or alloys thereof, and the metallization layers 314 may be formed by electroplating or deposition. In some embodiments, the material of the polymer dielectric layers 312 includes polyimide, epoxy resin, acrylic resin, phenol resin, BCB, PBO, or any other suitable polymer-based dielectric material.

As shown in FIG. 6B, a solder mask layer 320 is sequentially formed on the redistribution layer 310. The solder mask layer 320 is disposed on the exposed topmost layer of the metallization layers 314 of the redistribution layer 310, and portions of the exposed topmost layer of the metallization layers 314 is exposed by a plurality of first openings P1 and a plurality of second openings P2 defined in the solder mask layer 320. For example, in some embodiments, the solder mask layer 320 is formed on the exposed topmost layer of the metallization layers 314 of the redistribution layer 310 by coating and then patterned to form the plurality of the first openings P1 and the plurality of the second openings P2 to expose portions of the exposed topmost layer of the metallization layers 314, respectively. The patterning processes, for example, could be performed by photolithography and/or etching processes.

The portion of the exposed topmost layer of the metallization layers 314 is exposed by the plurality of the first openings P1 in the solder mask layer 320 is referred as a first portion 332 of a plurality of first bonding pads 330, and the portion of the exposed topmost layer of the metallization layers 314 is exposed by the plurality of the second openings P2 in the solder mask layer 320 is referred as a plurality of second bonding pads 340. The first portion 332 of the plurality of first bonding pads 330 and the plurality of second bonding pads 340 may include conductive pads (e.g., aluminum pads, copper pads or the like), conductive pillars (e.g. solder pillars, gold pillars, copper pillars or the like), conductive bumps (e.g., reflowed solder bumps, gold bumps, copper bumps or the like) or the combinations thereof.

Figure 6C:
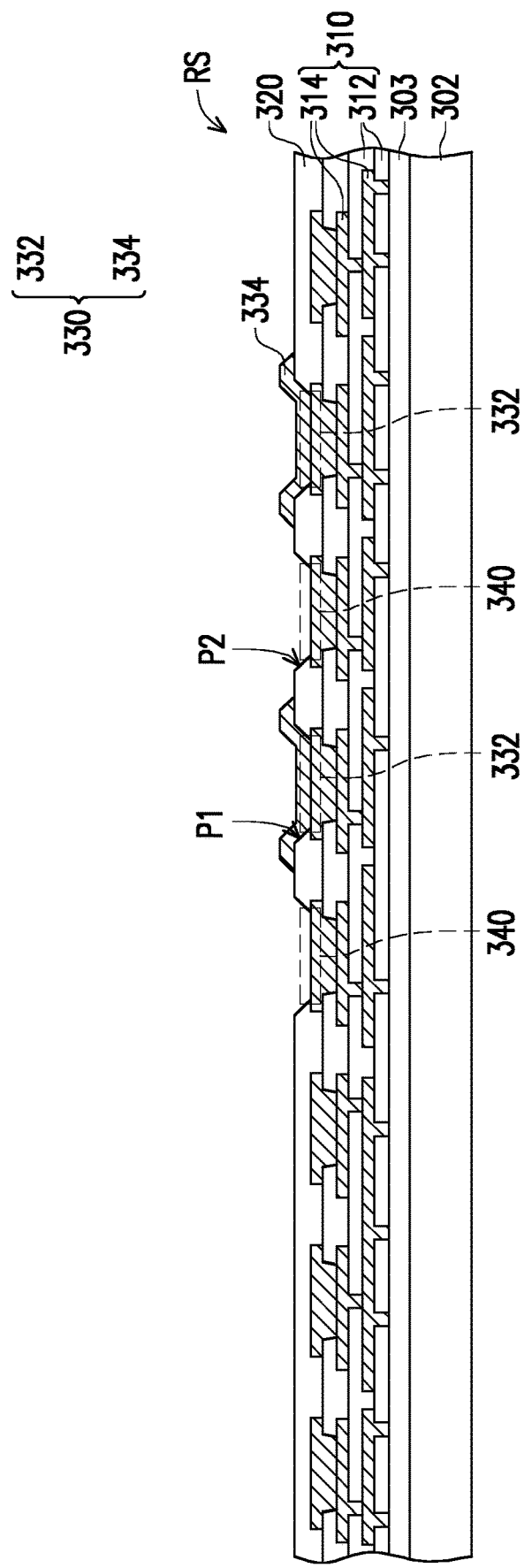

In FIG. 6C, a second portion 334 of the plurality of the first bonding pads 330 is formed in the plurality of the first openings P1 in the solder mask layer 320 and extends to a surface 320a of the solder mask layer 320. The second portion 334 of the plurality of the first bonding pads 330 contacts the first portion 332. As shown in FIG. 6B and FIG. 6C, the solder mask layer 320 is disposed on the substrate 210 and separates the plurality of the first bonding pads 330 from the plurality of the second bonding pads 340.

In some embodiments, the second portion 234 of the plurality of the first bonding pads 230 is formed on the first portion 332 of the plurality of the first bonding pads 330 by wire bonding machine, and the second portion 234 can be a stud bump. In some embodiments, a material of the second portion 334 of the plurality of the first bonding pads 330 is the same as the material of the first portion 332 of the plurality of the first bonding pads 330, however the disclosure is not limited thereto. In another embodiment, the material of the second portion 334 of the plurality of the first bonding pads 330 differs from the material of the first portion 332 of the plurality of the first bonding pads 330.

In some embodiments, the plurality of the first bonding pads 330 may be referred to as a UBM-like pad. In some embodiments, the first portion 332 of the plurality of the first bonding pads 330 is a part of the redistribution layer 310. In some embodiments, the plurality of the second bonding pads 340 may be referred to as a solder mask defined (SMD) pad. In some embodiments, the plurality of the second bonding pads 340 is a part of the redistribution layer 310. In some embodiments, the first portion 332 of the plurality of the first bonding pads 330 and the plurality of the second bonding pads 340 are in the same layer. Up to this step, the redistribution layer circuit structure RS is manufactured.

Figure 6D:
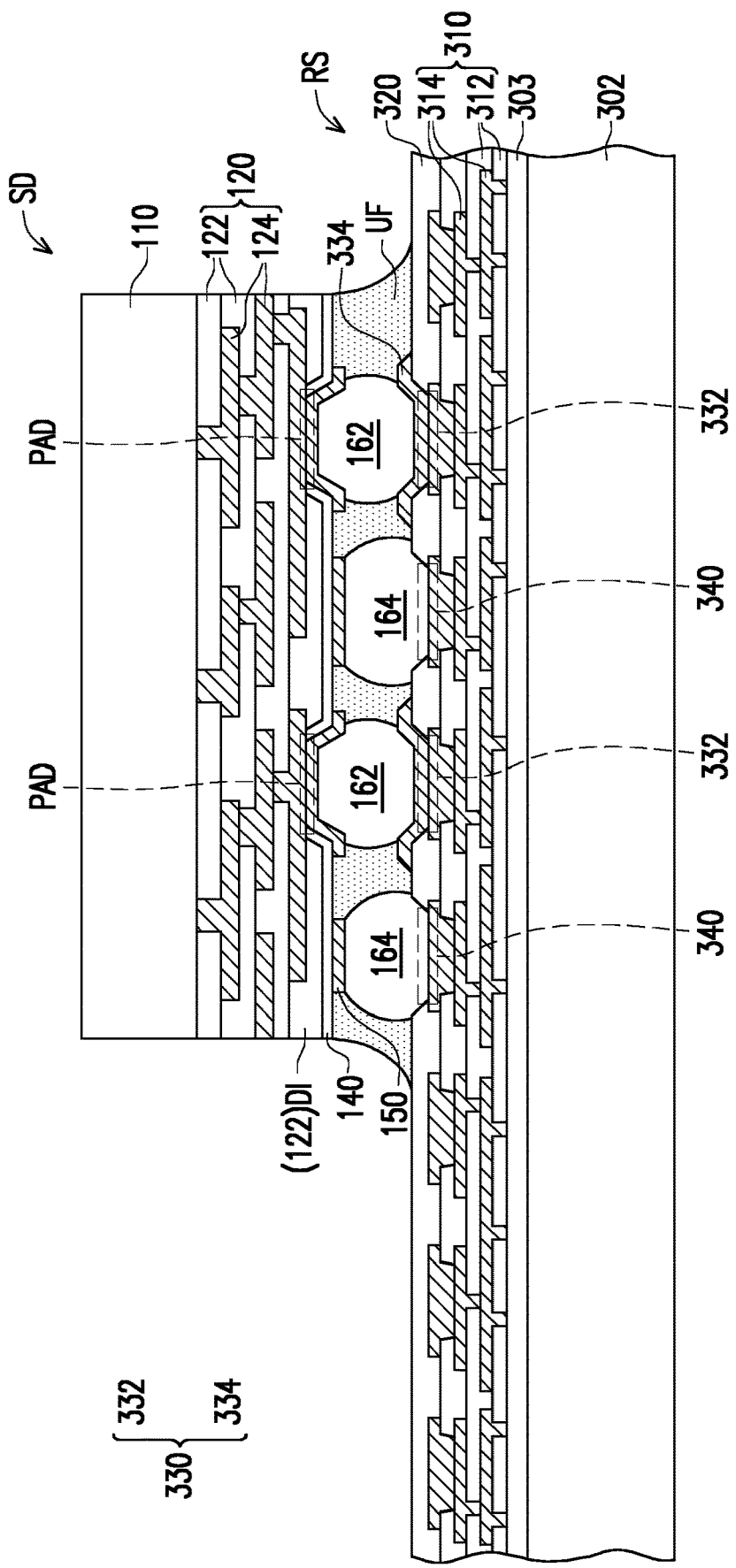

In FIG. 6D, a semiconductor device SD is provided and disposed on the plurality of the first bonding pads 330 and the plurality of the second bonding pads 340 of the redistribution layer circuit structure RS. The semiconductor device SD in FIG. 6D is the semiconductor device SD depicted in FIG. 1E, the detailed description regarding the semiconductor device SD in FIG. 6D can be found above, and a repeated description of the same technical contents is omitted.

As mentioned above, the semiconductor device SD includes the integrated circuit, the buffer layer 140, the plurality of the conductive pads 150, the plurality of the connecting terminals 162, and the at least one dummy conductor 164. The integrated circuit has the semiconductor substrate 110 and the interconnection structure 120, wherein the interconnection structure 120 is disposed on the semiconductor substrate 110. The buffer layer 140 is disposed on the interconnection structure 120 of the integrated circuit, in which the integrated circuit has the plurality of the connecting pads PAD (e.g., the portion of the topmost patterned conductive layer 124 of the interconnection structure 120 exposed by the plurality of the openings O2 in the buffer layer 140), and the dielectric layer DI (e.g., the topmost inter-dielectric layer 122 of the interconnection structure 120) partially exposes the plurality of the connecting pads PAD.

A portion of the plurality of the conductive pads 150 is disposed on and electrically connected to the plurality of the connecting pads PAD exposed by the buffer layer 140 (and the dielectric layer DI), and a portion of the plurality of the conductive pads 150 is disposed on the buffer layer 140 and electrically isolated from the plurality of the connecting pads PAD exposed by the buffer layer 140 (and the dielectric layer DI). The plurality of the connecting terminals 162 is electrically connected to the portion of the plurality of the conductive pads 150 electrically connected to the plurality of the connecting pads PAD exposed by the buffer layer 140, and the at least one dummy conductor 164 is electrically connected to the portion of the plurality of the conductive pads 150 disposed on the buffer layer 140 and electrically isolated from the plurality of the connecting pads PAD.

Owing to structure of the plurality of the connecting terminals 162, the substantial topology variation ΔH between the plurality of the connecting terminals 162 and the at least one dummy conductor 164 is noticeable and is at least 3 μm. In some embodiments, the substantial topology variation ΔH is between 3 μm to 10 μm. Due to the controllable substantial topology variation ΔH mentioned above, smaller critical dimensions are permissible for the plurality of the connecting terminals 162 and the at least one dummy conductor 164. In some embodiments, a diameter of at least one of the plurality of the connecting terminals 162 is different from a diameter of the at least one dummy conductor 164. In some embodiments, the at least one dummy conductor 164 includes, for example, two or more dummy conductors, wherein the two or more dummy conductors may have different diameters.

As shown in FIG. 6D, the semiconductor device SD is flipped (turned upside down) and then disposed to the redistribution layer circuit structure RS. In other words, the semiconductor device SD and the redistribution layer circuit structure RS are bonded through flip chip bonding technology. In some embodiments, a underfill UF at least fills the gaps between the semiconductor device SD and the redistribution layer circuit structure RS. In one embodiment, the underfill UF may be formed by underfill dispensing or any other suitable method.

As shown in FIG. 6D, in some embodiments, the integrated circuit of the semiconductor device SD is bonded to the redistribution layer circuit structure RS through the plurality of the connecting terminals 162, the at least one dummy conductor 164, the plurality of the first bonding pads 330, and the second bonding pads 340 disposed therebetween. Due to the substantial topology variation ΔH presented in the semiconductor device SD, the plurality of the connecting terminals 162 of the semiconductor device SD is connected to the second portion 334 of the plurality of the first bonding pads 330 of the redistribution layer circuit structure RS, and the at least one dummy conductor 164 of the semiconductor device SD is connected to the plurality of the second bonding pads 340 of the redistribution layer circuit structure RS. The semiconductor device SD is electrically connected to the redistribution layer circuit structure RS through the plurality of the connecting terminals 162 and the plurality of the first bonding pads 330. Up to this step, the semiconductor package is manufactured.

As mentioned above, the substantial topology variation ΔH is adjustable and controllable, and smaller critical dimensions are permissible for the plurality of the connecting terminals 162 and the at least one dummy conductor 164, thus the better process control can be obtained. Owing to the at least one dummy conductor 164, a mechanical strength of the semiconductor package is enhanced after the semiconductor device SD is bonded to the redistribution layer circuit structure RS.

It should be noted that, in some embodiments, due to the substantial topology variation ΔH presented in the semiconductor device SD, one semiconductor package may include different configurations between the plurality of the connecting terminals 162 and the plurality of the first bonding pads 330 (e.g., the UBM-like pad or the UBM-like pad having an additional protruding portion) and/or between the at least one dummy conductor 164 and the plurality of the second bonding pads 340 (e.g., the SMD pad or the NSMD pad). The disclosed is not limited to the embodiment depicted in FIG. 6D. In certain embodiments, as the at least one dummy conductor is electrically grounded, a signal integrity enhancement and/or a noise reduction of the semiconductor package can be obtained.

According to some embodiments, a semiconductor device includes an integrated circuit, a dielectric layer, a plurality of connecting terminals and at least one dummy conductor. The integrated circuit has a plurality of connecting pads, and the dielectric layer is disposed on and partially exposes the plurality of the connecting pads by a plurality of openings defined in the dielectric layer. The plurality of the connecting terminals is disposed on the plurality of the connecting pads exposed by the plurality of the openings. The at least one dummy conductor is disposed on the dielectric layer and electrically isolated from the integrated circuit. A substantial topology variation is between the plurality of the connecting terminals and the at least one dummy conductor.

According to some embodiments, a semiconductor package includes a circuit substrate and a semiconductor device. The semiconductor device disposed on the circuit substrate and includes an integrated circuit, a dielectric layer, a plurality of connecting terminals and at least one dummy conductor. The integrated circuit has a plurality of connecting pads, and a dielectric layer is disposed on and partially exposes the plurality of the connecting pads by a plurality of openings defined in the dielectric layer. The plurality of the connecting terminals is disposed on the plurality of the connecting pads exposed by the plurality of the openings. The at least one dummy conductor is disposed on the dielectric layer and electrically isolated from the integrated circuit. A substantial topology variation is between the plurality of the connecting terminals and the at least one dummy conductor. The semiconductor device is bonded onto the circuit substrate through the plurality of the connecting terminals and the at least one dummy conductor.

According to some embodiments, a semiconductor package includes an integrated circuit, a dielectric layer, a plurality of connecting terminals, at least one dummy conductor, and a redistribution layer circuit structure. The integrated circuit has a plurality of connecting pads, and a dielectric layer is disposed on and partially exposes the plurality of the connecting pads by a plurality of openings defined in the dielectric layer. The plurality of connecting terminals is disposed on the plurality of the connecting pads exposed by the plurality of the openings. The at least one dummy conductor is disposed on the dielectric layer and electrically isolated from the integrated circuit. A substantial topology variation is between the plurality of the connecting terminals and the at least one dummy conductor. The integrated circuit is bonded onto the redistribution layer circuit structure through the plurality of the connecting terminals and the at least one dummy conductor.

According to some embodiments, a semiconductor package includes a circuit substrate and a semiconductor device. The circuit substrate has a plurality of first conductive pads and a plurality of second conductive pads each separated from the plurality of first conductive pads, where the circuit substrate includes a solder mask layer with a plurality of first recesses and a plurality of second recesses defined therein. The semiconductor device is disposed on the circuit substrate, where the semiconductor device includes: an integrated circuit having a plurality of connecting pads; a plurality of connecting terminals disposed on the plurality of connecting pads; and at least one dummy conductor disposed on and electrically isolated from the integrated circuit, where the semiconductor device is bonded to the circuit substrate through connecting the plurality of connecting terminals to the plurality of first conductive pads and connecting the at least one dummy conductor to one of the plurality of second conductive pads, and there is a level difference between horizontal interfaces of the plurality of connecting terminals and the plurality of first conductive pads and a horizontal interface of the at least one dummy conductor and the one of the plurality of second conductive pads. Each of the plurality of second conductive pads is exposed by a corresponding one of the plurality of second recesses and is spaced apart from a sidewall thereof.

According to some embodiments, a semiconductor package includes an integrated circuit, a plurality of connecting terminals, a plurality of dummy conductors, and a redistribution layer circuit structure. The plurality of connecting terminals are disposed on and electrically connected to the integrated circuit. The plurality of dummy conductors are disposed on and electrically isolated from the integrated circuit. The redistribution layer circuit structure has a plurality of first conductive pads and a plurality of second conductive pads each separated from the plurality of first conductive pads, where the redistribution layer circuit structure includes a solder mask layer with a plurality of first recesses and a plurality of second recesses defined therein. The integrated circuit is bonded to the redistribution layer circuit structure through connecting the plurality of connecting terminals to the plurality of first conductive pads and connecting the plurality of dummy conductors to the plurality of second conductive pads. There is a level difference between horizontal interfaces of the plurality of connecting terminals and the redistribution layer circuit structure and a horizontal interface of the plurality of dummy conductors and the redistribution layer circuit structure. The plurality of second conductive pads each are exposed by a respective one of the plurality of second recesses and each are spaced apart from a sidewall of the corresponding one of the plurality of second recesses.

According to some embodiments, a method of manufacturing a semiconductor package includes the following steps: providing a circuit structure having a first conductive pad, a second conductive pad and a solder mask layer having a first recess and a second recess formed therein, wherein the second conductive pad is within the second recess and spacing apart from a sidewall of the second recess, and the first conductive pad is in the first recess; providing a semiconductor device comprising an integrated circuit, a first conductive terminal and a second conductive terminal, the first conductive terminal being disposed on and electrically connected to the integrated circuit and the second conductive conductor being disposed on and electrically isolated from the integrated circuit; and mounting the semiconductor device to the circuit structure by connecting the first conductive terminal to the first conductive pad and connecting the second conductive terminal to the second conductive pad, wherein there is a level difference between a horizontal interface of the first conductive terminal and the first conductive pad and a horizontal interface of the second conductive conductor and the second conductive pads along a stacking direction of the semiconductor device and the circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
  a circuit substrate, comprising a plurality of first conductive pads, a plurality of second conductive pads each separated from the plurality of first conductive pads, and a solder mask layer with a plurality of first recesses and a plurality of second recesses defined therein; and
  a semiconductor device, disposed on the circuit substrate, wherein the semiconductor device comprises:
    an integrated circuit, comprising a plurality of first connecting pads and a plurality of second connecting pads;
    a plurality of connecting terminals, disposed over and electrically coupled to the integrated circuit, wherein the plurality of connecting terminals are electrically coupled to the integrated circuit by disposing on the plurality of first connecting pads; and
    at least one dummy conductor, disposed over and electrically isolated from the integrated circuit, wherein the at least one dummy conductor is electrically isolated from the integrated circuit by disposing on a respective one of the plurality of second connecting pads, wherein the semiconductor device is bonded to the circuit substrate through connecting the plurality of connecting terminals to the plurality of first conductive pads and connecting the at least one dummy conductor to one of the plurality of second conductive pads, and there is a level difference between horizontal interfaces of the plurality of connecting terminals and the plurality of first conductive pads and a horizontal interface of the at least one dummy conductor and the one of the plurality of second conductive pads,
  wherein the at least one dummy conductor is electrically floated or grounded.

2. The semiconductor package as claimed in claim 1, wherein each of the plurality of connecting terminals comprises:
  a first conductive portion; and
  a second conductive portion, connecting to the first conductive portion, wherein a sum of a height of the first conductive portion and a height of the second conductive portion is equal to a height of the at least one dummy conductor.

3. The semiconductor package as claimed in claim 1, wherein a diameter of at least one of the plurality of connecting terminals is different from a diameter of the at least one dummy conductor.

4. The semiconductor package as claimed in claim 1, wherein each of the plurality of first conductive pads comprises:
  a first portion, partially exposed by one of the plurality of first recesses and connected to a respective one of the plurality of connecting terminals; and
  a second portion, connecting to the first portion, wherein the second portion is located in the one of the plurality of first recesses and is extended to a surface of the solder mask layer facing toward the semiconductor device.

5. The semiconductor package as claimed in claim 4, wherein each of the plurality of first conductive pads further comprises a third portion connecting to the second portion, and the third portion protrudes away from the second portion.

6. The semiconductor package as claimed in claim 1, wherein each of the plurality of second conductive pads is partially covered by the solder mask layer.

7. The semiconductor package as claimed in claim 1, wherein each of the plurality of second conductive pads is exposed by and separated from the solder mask layer.

8. The semiconductor package as claimed in claim 1, further comprising:
  an underfill located in a gap between the semiconductor device and the circuit substrate.

9. The semiconductor package as claimed in claim 8, wherein the underfill is further in contact with the plurality of first conductive pads, and is free from the plurality of second conductive pads.

10. A semiconductor package, comprising:
  an integrated circuit, comprising a plurality of first connecting pads and a plurality of second connecting pads;
  a plurality of connecting terminals, disposed on and electrically connected to the integrated circuit, wherein the plurality of connecting terminals are electrically coupled to the integrated circuit by disposing on the plurality of first connecting pads;
  a plurality of dummy conductors, disposed on and electrically isolated from the integrated circuit, wherein the plurality of dummy conductors are electrically isolated from the integrated circuit by disposing on the plurality of second connecting pads; and
  a redistribution layer circuit structure, comprising a plurality of first conductive pads connected to the plurality of connecting terminals, a plurality of second conductive pads connected to the plurality of dummy conductors and separated from the plurality of first conductive pads,
  wherein there is a level difference between horizontal interfaces of the plurality of connecting terminals and the redistribution layer circuit structure and horizontal interfaces of the plurality of dummy conductors and the redistribution layer circuit structure, and
  wherein the plurality of dummy conductors are electrically floated or grounded.

11. The semiconductor package as claimed in claim 10, wherein each of the plurality of connecting terminals comprises:
  a first conductive portion; and
  a second conductive portion, connecting to the first conductive portion, wherein a sum of a height of the first conductive portion and a height of the second conductive portion is equal to a height of at least one of the plurality of dummy conductors.

12. The semiconductor package as claimed in claim 10, wherein a diameter of at least one of the plurality of connecting terminals is different from a diameter of at least one of the plurality of dummy conductors.

13. The semiconductor package as claimed in claim 10, wherein each of the plurality of second conductive pads is at least partially covered by a respective one of the plurality of dummy conductors.

14. The semiconductor package as claimed in claim 10, wherein each of the plurality of first conductive pads comprises:
- a first portion, partially exposed by one of a plurality of first recesses formed in a solder mask layer disposed on the redistribution layer circuit structure facing toward the integrated circuit and connected to a respective one of the plurality of connecting terminals; and
- a second portion, connecting to the first portion, wherein the second portion is located in the one of the plurality of first recesses and is extended to a surface of the solder mask layer.

15. The semiconductor package as claimed in claim 14, wherein each of the plurality of first conductive pads further comprises a third portion connecting the second portion, and the third portion protrudes away from the second portion.

16. The semiconductor package as claimed in claim 10, wherein a sidewall of the redistribution layer circuit structure is offset from a sidewall of the integrated circuit.

17. A method of manufacturing a semiconductor package, comprising:
- providing a circuit structure having a plurality of first conductive pads, a plurality of second conductive pads each separated from the plurality of first conductive pads, and a solder mask layer having a plurality of first recesses and a plurality of second recesses formed therein;
- providing a semiconductor device comprising an integrated circuit comprising a plurality of first connecting pads and a plurality of second connecting pads, a plurality of connecting terminals disposed over and electrically coupled to the integrated circuit and at least one dummy conductor disposed over and electrically isolated from the integrated circuit, wherein the plurality of connecting terminals are electrically coupled to the integrated circuit by disposing on the plurality of first connecting pads, and the at least one dummy conductor is electrically isolated from the integrated circuit by disposing on a respective one of the plurality of second connecting pads; and
- mounting the semiconductor device to the circuit structure by connecting the plurality of connecting terminals to the plurality of first conductive pads and connecting the at least one dummy conductor to one of the plurality of second conductive pads, wherein there is a level difference between horizontal interfaces of the plurality of connecting terminals and the plurality of first conductive pads and a horizontal interface of the at least one dummy conductor and the one of the plurality of second conductive pads along a stacking direction of the semiconductor device and the circuit structure, and the at least one dummy conductor is electrically floated or grounded.

18. The method as claimed in claim 17, wherein prior to providing the semiconductor device, the method further comprises:
- forming the semiconductor device, comprising:
  - providing a semiconductor substrate having semiconductor components;
  - forming an interconnect over the semiconductor substrate, wherein the interconnect comprises the plurality of first connecting pads and the plurality of second connecting pads; and
  - disposing the plurality of connecting terminals and the at least one dummy conductor on the interconnect, the plurality of connecting terminals being electrically connected to the semiconductor components through the plurality of first connecting pads, and the at least one dummy conductor being electrically isolated from the semiconductor components through the respective one of the plurality of second connecting pads.

19. The method as claimed in claim 18, wherein providing the semiconductor substrate having the semiconductor components comprises providing the semiconductor substrate in a wafer form.

20. The method as claimed in claim 19, wherein forming the semiconductor device further comprises:
- dicing the semiconductor substrate to form the semiconductor device after disposing the plurality of connecting terminals and the at least one dummy conductor.

* * * * *